United States Patent
Lin et al.

(10) Patent No.: US 11,296,064 B2
(45) Date of Patent: Apr. 5, 2022

(54) SUBSTRATE STRUCTURE WITH BURIED CHIP AND LIGHT EMITTING DEVICE USING THE SAME

(71) Applicants: LITE-ON OPTO TECHNOLOGY (CHANGZHOU) CO., LTD., Changzhou (CN); LITE-ON TECHNOLOGY CORPORATION, Taipei (TW)

(72) Inventors: Chen-Hsiu Lin, New Taipei (TW); Tsung-Kang Ying, New Taipei (TW); Erh-Chan Hsu, Tainan (TW)

(73) Assignees: LITE-ON OPTO TECHNOLOGY (CHANGZHOU) CO., LTD., Changzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 16/898,617

(22) Filed: Jun. 11, 2020

(65) Prior Publication Data

US 2020/0395349 A1    Dec. 17, 2020

Related U.S. Application Data

(60) Provisional application No. 62/860,883, filed on Jun. 13, 2019.

(30) Foreign Application Priority Data

Apr. 20, 2020 (CN) .......................... 202010313649.4

(51) Int. Cl.
*H01L 29/18* (2006.01)
*H01L 33/00* (2010.01)
(Continued)

(52) U.S. Cl.
CPC .......... *H01L 25/167* (2013.01); *F21V 31/005* (2013.01); *H01L 23/485* (2013.01);
(Continued)

(58) Field of Classification Search
CPC ..... H01L 23/50; H01L 24/24; H01L 23/5389; H01L 23/49822; H01L 24/82;
(Continued)

(56) References Cited

U.S. PATENT DOCUMENTS

2014/0317907 A1* 10/2014 Sun ........................ H05K 13/00
 29/592.1
2019/0280163 A1* 9/2019 Li ........................ H01L 33/501
(Continued)

*Primary Examiner* — Ismail A Muse
(74) *Attorney, Agent, or Firm* — Li & Cai Intellectual Property (USA) Office

(57) ABSTRACT

A substrate structure with a buried chip and a light emitting device using the same are provided. The substrate structure includes a base layer, a control chip, a filling layer, a first upper resin layer and a first lower resin layer. The substrate layer has a first surface, a second surface opposite to the first surface, and an opening passing through the first surface and the second surface. The control chip is disposed in the opening, and an annular space having a specific width is defined by an outer wall surface of the control chip and an inner wall surface of the opening. The filling layer is filled in the annular space. The first upper resin layer and the first lower resin layer are respectively disposed on the first surface and the second surface of the base layer.

11 Claims, 18 Drawing Sheets

(51) Int. Cl.
*H01L 25/16* (2006.01)
*H01L 33/62* (2010.01)
*H01L 23/485* (2006.01)
*H01L 25/075* (2006.01)
*H01L 33/50* (2010.01)
*H01L 33/58* (2010.01)
*F21V 31/00* (2006.01)
*H01L 33/40* (2010.01)
*H01L 33/56* (2010.01)
*H01L 33/60* (2010.01)

(52) U.S. Cl.
CPC ........ *H01L 25/0753* (2013.01); *H01L 33/405* (2013.01); *H01L 33/502* (2013.01); *H01L 33/505* (2013.01); *H01L 33/56* (2013.01); *H01L 33/58* (2013.01); *H01L 33/60* (2013.01); *H01L 33/62* (2013.01)

(58) Field of Classification Search
CPC ....... H01L 21/4857; H01L 2924/15311; H01L 2224/92; H01L 2924/19041; H01L 2224/24226; H01L 2224/73267; H01L 2924/1517; H01L 2224/92244; H01L 2924/01029; H01L 2924/15153; H01L 25/0657; H01L 2224/16; H01L 2924/01078; H01L 2924/01079; H01L 2924/01011; H01L 2924/01033; H01L 2924/01006; H01L 2924/014; H01L 2225/1035; H01L 2224/32225; H01L 2224/04105; H01L 2224/16235; H01L 2224/0401; H05K 1/185; H05K 3/4644
See application file for complete search history.

(56) References Cited

U.S. PATENT DOCUMENTS

2020/0357749 A1* 11/2020 Chen ................. H01L 23/49838
2020/0357750 A1* 11/2020 Chen ..................... H01L 25/105
2020/0358163 A1* 11/2020 See ......................... H01L 24/19
2020/0395304 A1* 12/2020 Chen ................. H01L 23/49894
2020/0395305 A1* 12/2020 Chen ...................... H01L 23/13
2020/0395306 A1* 12/2020 Chen .................. H01L 21/4846

* cited by examiner

SUBSTRATE STRUCTURE WITH BURIED CHIP AND LIGHT EMITTING DEVICE USING THE SAME

CROSS-REFERENCE TO RELATED PATENT APPLICATION

This application claims priority from the U.S. Provisional Patent Application Ser. No. 62/860,883 filed Jun. 13, 2019, which application is incorporated herein by reference in its entirety.

This application claims the benefit of priority to China Patent Application No. 202010313649.4, filed on Apr. 20, 2020 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a substrate structure, and more particularly to a substrate structure with a buried chip and a light emitting device using the substrate structure.

BACKGROUND OF THE DISCLOSURE

Light emitting diodes (LED) have the advantages of small size, high luminous efficiency, low energy consumption and being environment-friendly, and can produce lights in various colors. Therefore, LED package products are now widely used in display devices. In practice, the LED package products use a group of LEDs having the same color or different colors to produce a desired lighting effect. In order to control the lighting characteristics of the LEDs, the LEDs are packaged on a single-layered circuit board together with an individual IC chip.

However, under the above-mentioned structure, the LEDs are electrically connected to the IC chip by wire bonding, and thus spaces are required to be reserved on the circuit board for wire bonding. As a result, the gaps between the LEDs may not be reduced significantly, which is unfavorable for product miniaturization. In addition, lights emitted at some angles may be blocked by the IC chip, which negatively affects the lighting effect (e.g., white balance) of the LED package products. In addition, the wire bonding process is relatively complicated, and the wires formed thereby can easily break under stress, resulting in poor reliability of the LED packaging products.

SUMMARY OF THE DISCLOSURE

In response to the above-referenced technical inadequacies, the present disclosure provides a substrate structure with a buried chip, in which the substrate structure can provide protection for the buried chip and ensure the normal operation of the buried chip, and further provides a light emitting device using the substrate structure.

In one aspect, the present disclosure provides a substrate structure with a buried chip, which includes a base layer, a control chip, a filling layer, a first upper resin layer and a first lower resin layer. The base layer has a first surface, a second surface opposite to the first surface, and an opening passing through the first surface and the second surface, and the opening has an inner wall surface. The control chip is disposed in the opening, and an annular space having a width between 10 μm and 100 μm is defined by an outer wall surface of the control chip and the inner wall surface of the opening. The filling layer is filled in the annular space. The first upper resin layer is disposed on the first surface and the first lower resin layer is disposed on the second surface. The annular space is sealed by the first upper resin layer and the first lower resin layer. The control chip is fixed in place by the filling layer.

In certain embodiments, a thickness of the base layer is 0 μm to 20 μm less than a height of the control chip.

In certain embodiments, a thickness ratio of the first upper resin layer to the first lower resin layer is 1:1.

In certain embodiments, a material of the base layer is different from that of the first upper resin layer and that of the first lower resin layer.

In certain embodiments, the filling layer is integrated with the first upper resin layer and the first lower resin layer.

In certain embodiments, the annular space is not completely filled by the filling layer, and at least one void is formed in the annular space.

In certain embodiments, the substrate structure further includes a first upper patterned metal layer and a first lower patterned metal layer. The first upper patterned metal layer is disposed on the first upper resin layer. The first lower patterned metal layer is disposed on the first lower resin layer.

In certain embodiments, the base layer includes at least one conducting structure. The first upper patterned metal layer and the first lower patterned metal layer are electrically connected to each other by the at least one conducting structure.

In certain embodiments, the control chip has a plurality of electrical contacts on a surface thereof that is in proximity to the first surface. The electrical contacts are electrically connected to the first upper patterned metal layer.

In certain embodiments, the first lower patterned metal layer includes a metal mesh layer not having any electrical function and a metal conductive layer adjacent to the metal mesh layer. The metal conductive layer is connected to the at least one conducting structure.

In certain embodiments, the substrate structure further includes a second upper resin layer and a second lower resin layer. The second upper resin layer is disposed on the first upper patterned metal layer. The second lower resin layer is disposed on the first lower patterned metal layer.

In certain embodiments, the substrate structure further includes a second upper patterned metal layer and a second lower patterned metal layer. The second upper patterned metal layer is disposed on the second upper resin layer and is electrically connected to the first upper patterned metal layer. The second lower patterned metal layer is disposed on the second lower resin layer and is electrically connected to the first lower patterned metal layer.

In another aspect, the present disclosure provides a light emitting device, which includes the aforementioned substrate structure and a plurality of light emitting elements disposed on the substrate structure.

In certain embodiments, the second upper patterned metal layer defines a common electrode and a plurality of individual electrodes. Each of the light emitting elements has a first electrode and a second electrode. The first electrodes are all connected to the common electrode. The second electrodes are respectively connected to the individual electrodes.

In certain embodiments, the light emitting elements are all disposed on the common electrode.

One of the effects of the present disclosure is that the substrate structure can provide sufficient cushion and protection for the control chip and ensure the normal operation of the buried chip by the technical features of "the control chip is disposed in the opening of the base layer and defines an annular space having a width between 10 μm and 100 μm" and "the annular space is sealed by the first upper resin layer and the first lower resin layer." In addition, the light emitting device of the present disclosure, in which a plurality of light emitting elements are disposed on the substrate structure, can meet the design requirements of miniaturization and optimize the display effects of displaying devices.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
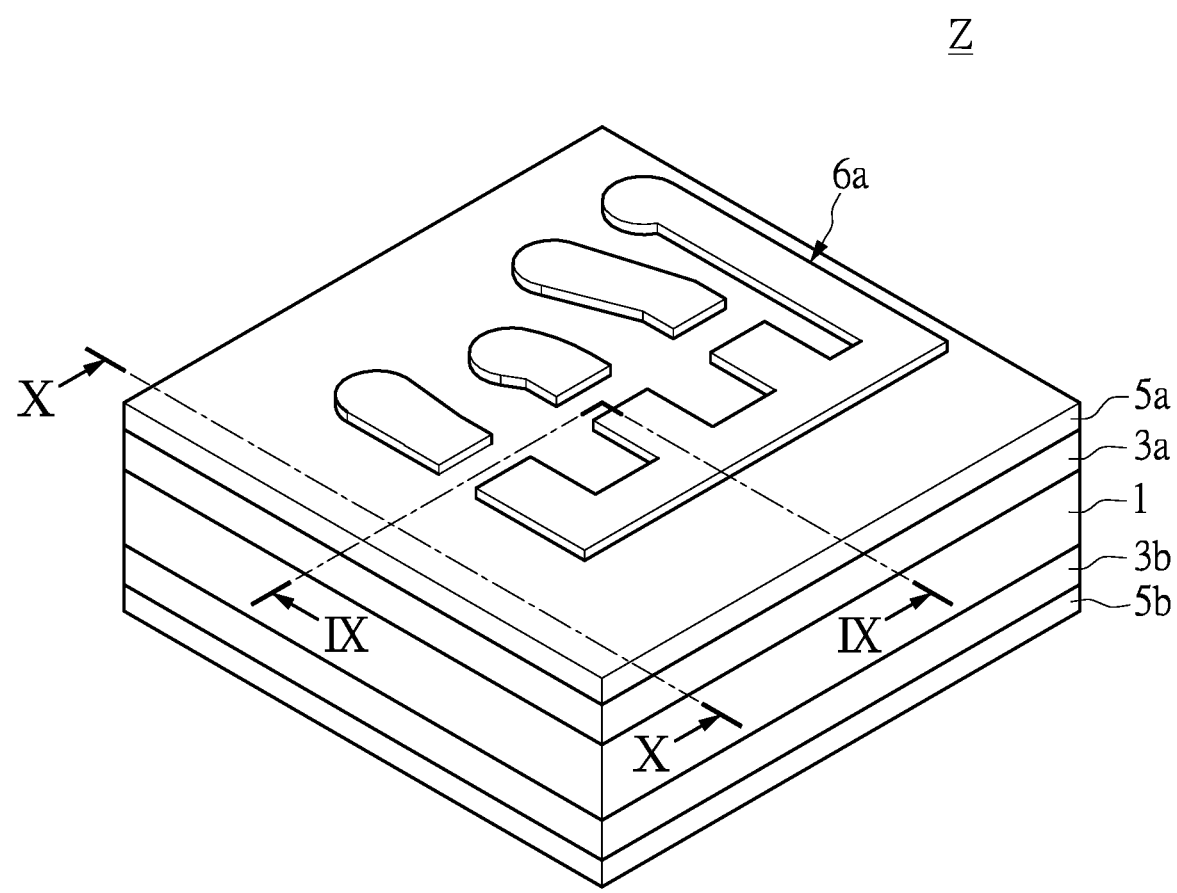
FIG. 1 is a perspective view of a substrate structure with a buried chip according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 10, a first embodiment of the present disclosure provides a substrate structure Z with a buried chip, which mainly includes a base layer 1, a control chip 2, a first upper resin layer 3a and a first lower resin layer 3b. The control chip 2 is buried in the base layer 1. The first upper resin layer 3a and the first lower resin layer 3b are disposed on the base layer 1 to package the control chip 2. The substrate structure Z of the present disclosure can be applied to a printed circuit board, but it is not limited thereto.

Reference is made to FIG. 2, FIG. 3, FIG. 6 and FIG. 9. The substrate layer 1 has a first surface 11, a second surface 12 opposite to the first surface 11, and an opening 13 passing through the first surface 11 and the second surface 12. The first surface 11 is exemplified by an upper surface, and the second surface 12 is exemplified by a lower surface. The control chip 2 is disposed in the opening 13, and a filling layer F is filled in a remaining space of the opening 13 to fix the control chip 2 in place. More specifically, the opening 13 of the base layer 1 has an inner wall surface 131, and the control chip 2 has an outer wall surface 21 that defines an annular space AS together with the inner wall surface 131 of the opening 13. The annular space AS has a width between 10 µm and 100 µm, and preferably between 30 µm and 50 µm.

The first upper resin layer 3a and the first lower resin layer 3b are respectively disposed on the first surface 11 and the second surface 12 of the base layer 1. Accordingly, the annular space AS is sealed by the first upper resin layer 3a and the first lower resin layer 3b. In the present embodiment, the filling layer F can be formed independently from or integrated with the first upper resin layer 3a and the first lower resin layer 3b. In certain embodiments, the filling layer F is formed by respective portions of the first upper resin layer 3a and the first lower resin layer 3b, which are filled in the annular space AS. In certain embodiments, the annular space AS is not completely filled by the filling layer F, and at least one void F0 is thus formed in the annular space AS, as shown in FIG. 9A.

Under the aforementioned structure, the annular space AS can be sealed by the first upper resin layer 3a and the first lower resin layer 3b, and the control chip 2 can be stably fixed in place by the filling layer F. Accordingly, the first upper resin layer 3a and the first lower resin layer 3b can provide sufficient cushion and protection for the control chip 2 to ensure the normal operation of the control chip 2, while the width of the annular space AS is between 10 µm and 100 µm. In the present embodiment, the thickness of the base layer 1 is less than or equal to the height of the control chip 2, such that electrodes of the control chip 2 can be protruded out of the base layer 1, which can increase the yield of the formation and plating of conductive vias. There is preferably a difference of about 0-20 µm between the thickness of the base layer 1 and the height of the control chip, and more preferably of 15 µm. In addition, a thickness ratio of the first upper resin layer 3a to the first lower resin layer 3b can be 1:1.

Furthermore, the material of the base layer 1 is different from that of the first upper resin layer 3a and that of the first lower resin layer 3b. For example, the base layer 1 is a BT (bismaleimide triazine) resin layer that may have a reinforcing material (e.g., glass fiber). The first upper resin layer 3a and the first lower resin layer 3b are each a PP (polypropylene) resin layer. The control chip 2 is an LED control chip. However, such examples are not meant to limit the scope of the present disclosure.

In practice, as shown in FIG. 2, FIG. 3, FIG. 5 and FIG. 7, the substrate structure Z of the present disclosure can further include a first upper patterned metal layer 4a and a first lower patterned metal layer 4b. The first upper patterned metal layer 4a can be disposed on the first upper resin layer 3a, and the first lower patterned metal layer 4b can be disposed on the first lower resin layer 3b. The first upper patterned metal layer 4a and the first lower patterned metal layer 4b define signal transmission lines and/or signal transmission interfaces. The first upper patterned metal layer 4a and the first lower patterned metal layer 4b may be made of copper, but they are not limited thereto.

Figure 5:
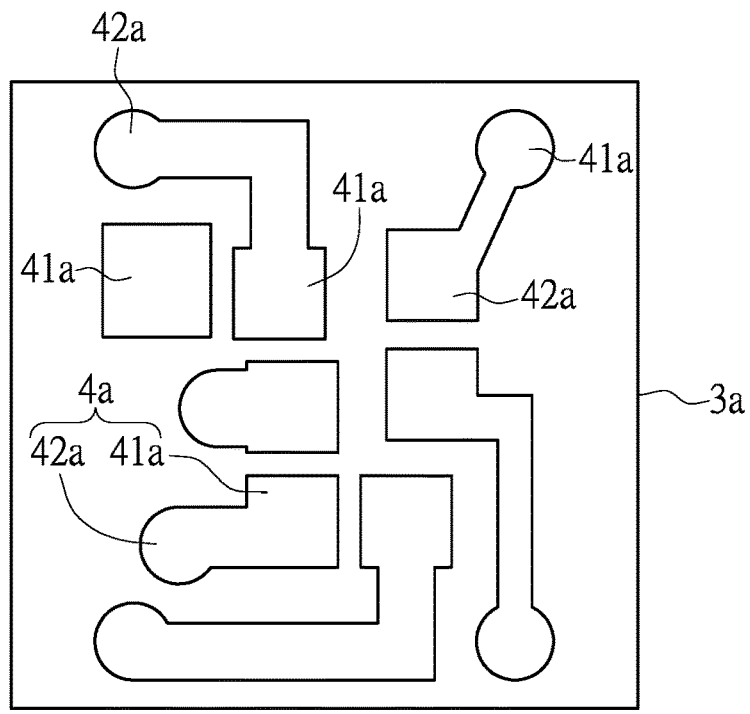
FIG. 5 is a top view of a first upper resin layer and a first upper patterned metal layer of the substrate structure with the buried chip according to the first embodiment of the present disclosure.
Figure 6:
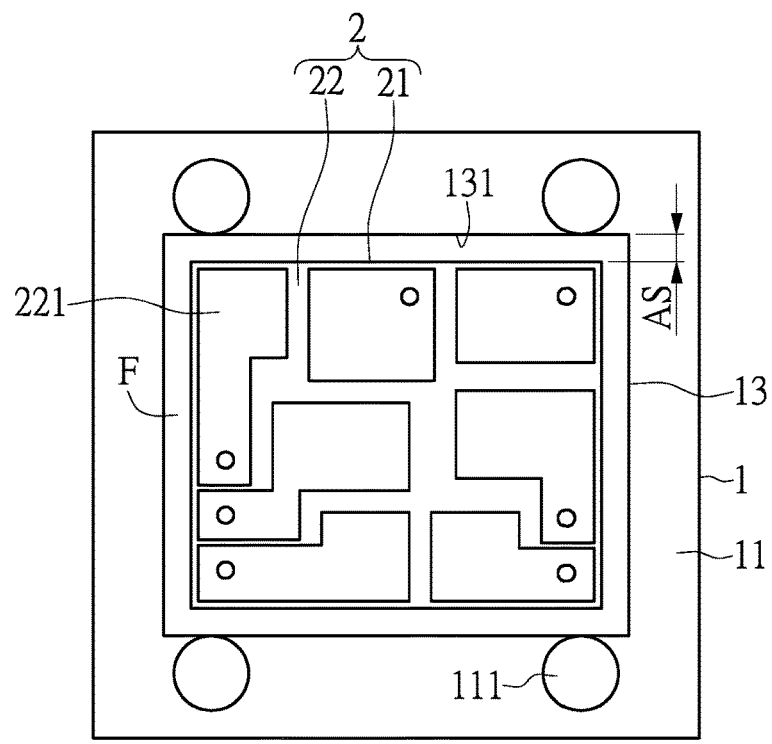
FIG. 6 is a top view of a base layer and a control chip of the substrate structure with the buried chip according to the first embodiment of the present disclosure.
Figure 7:
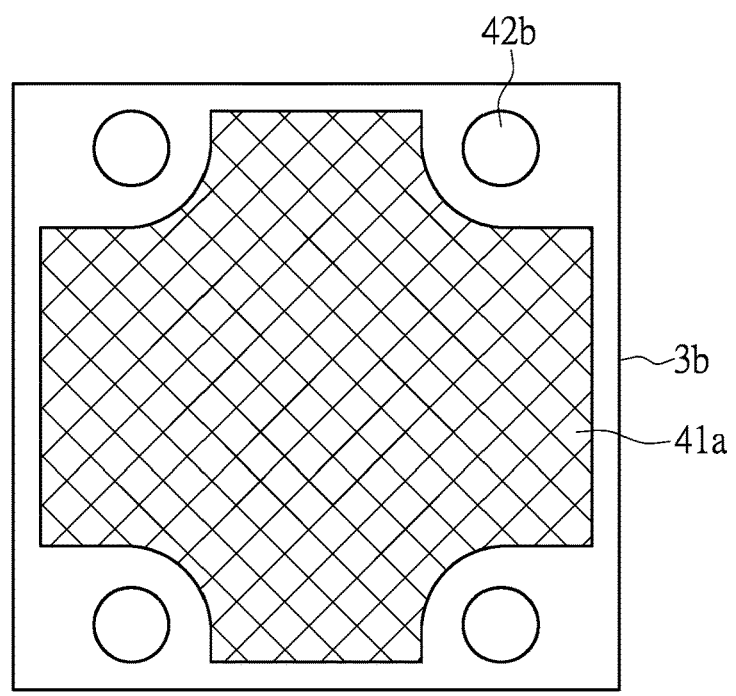
FIG. 7 is a bottom view of a first lower resin layer and a first lower patterned metal layer of the substrate structure with the buried chip according to the first embodiment of the present disclosure.
Figure 8:
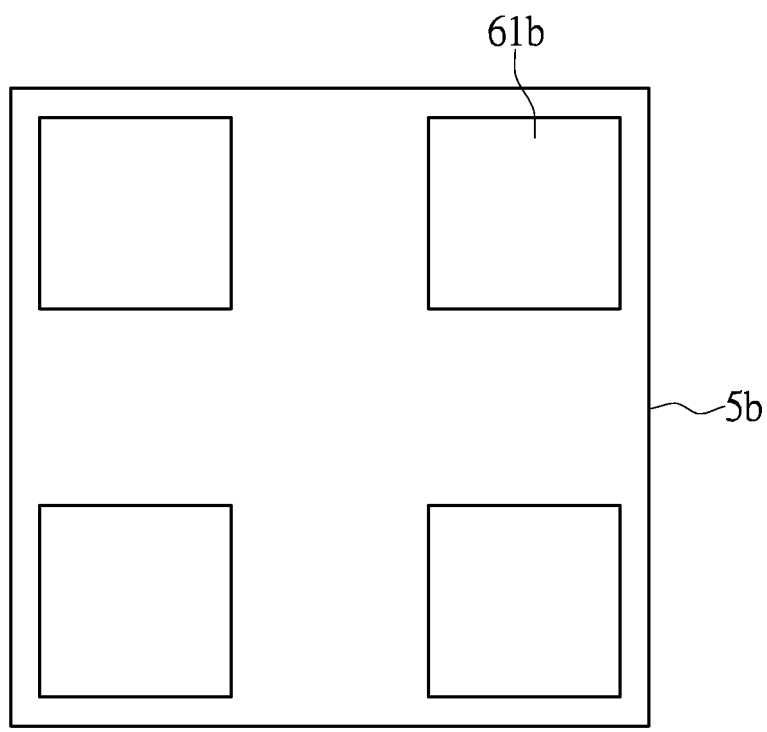
FIG. 8 is a bottom view of a second lower resin layer and a second lower patterned metal layer of the substrate structure with the buried chip according to the first embodiment of the present disclosure.
Figure 9:
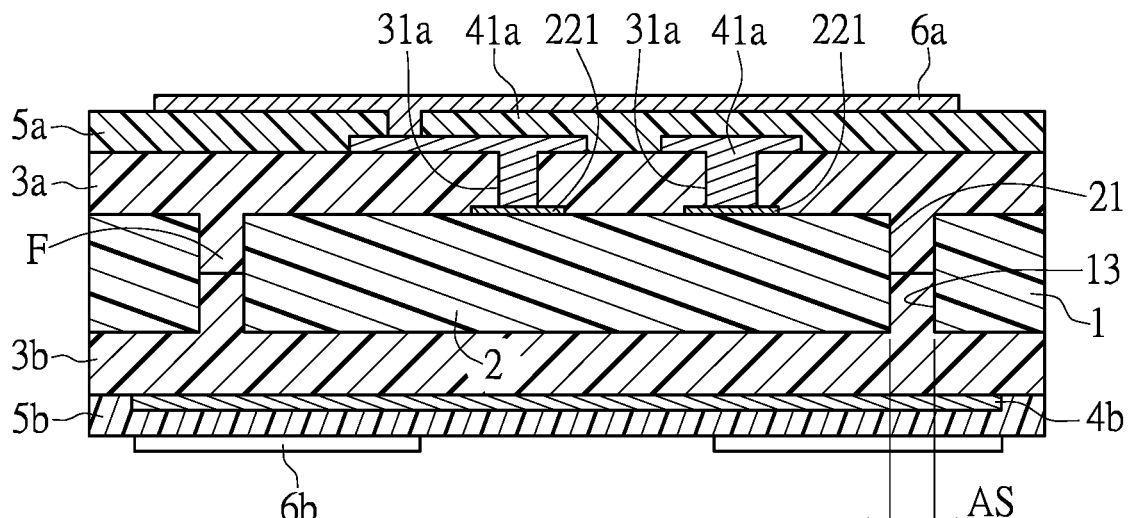
FIG. 9 is a sectional view taken along line IX-IX of FIG. 1.
Figure 9A:
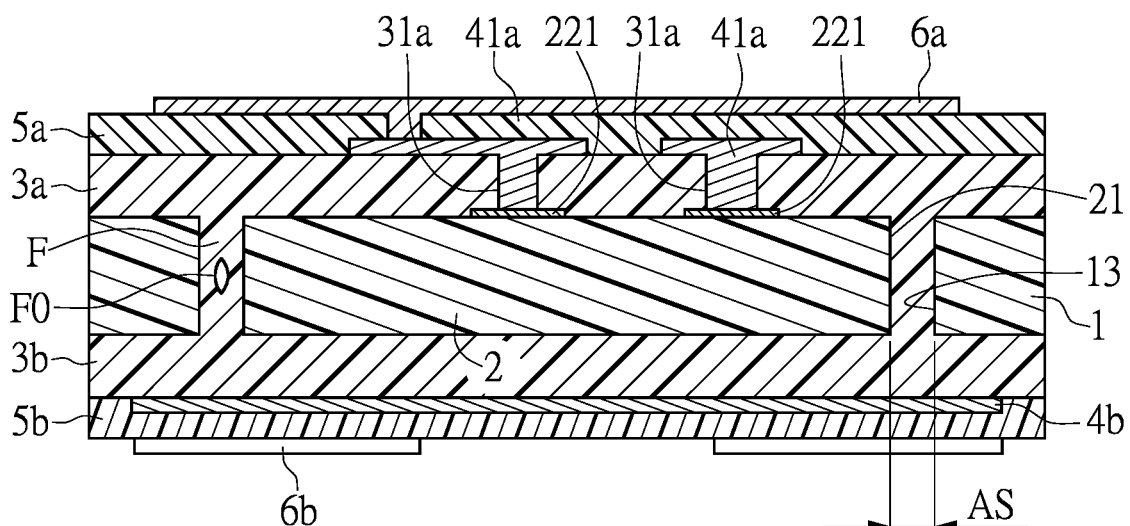
Figure 11:
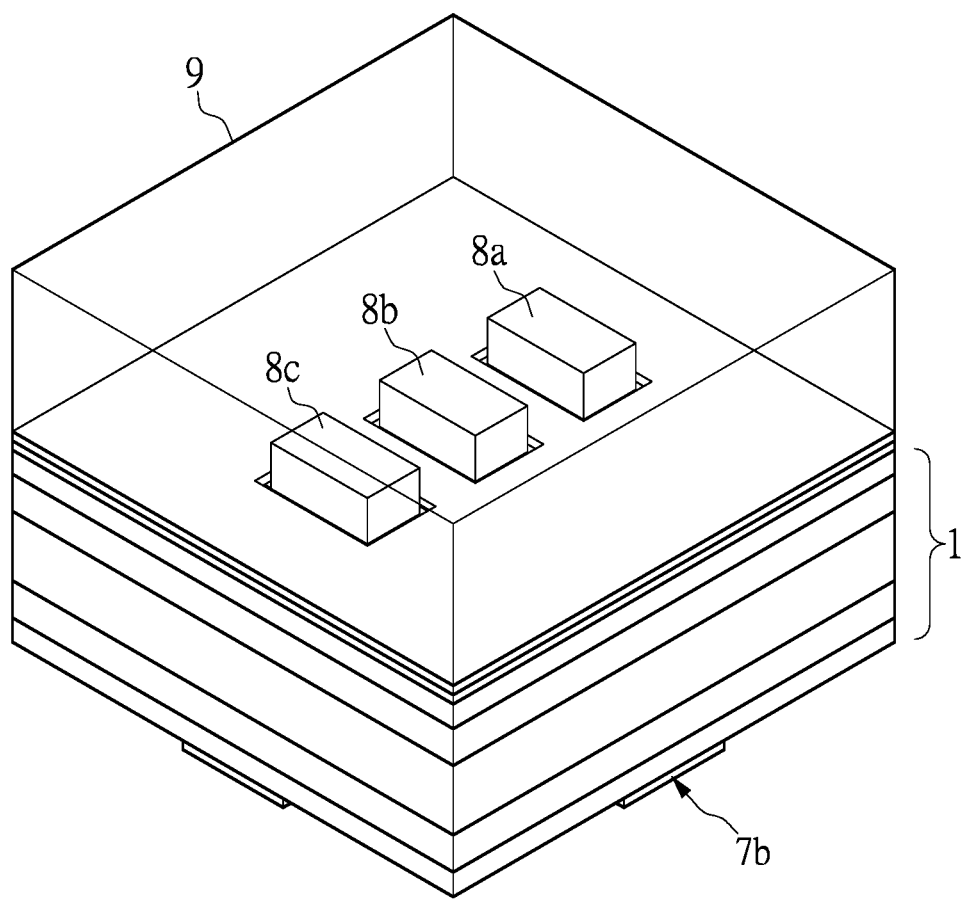
FIG. 11 is a perspective view of a light emitting device according to a second embodiment of the present disclosure.
Figure 12:
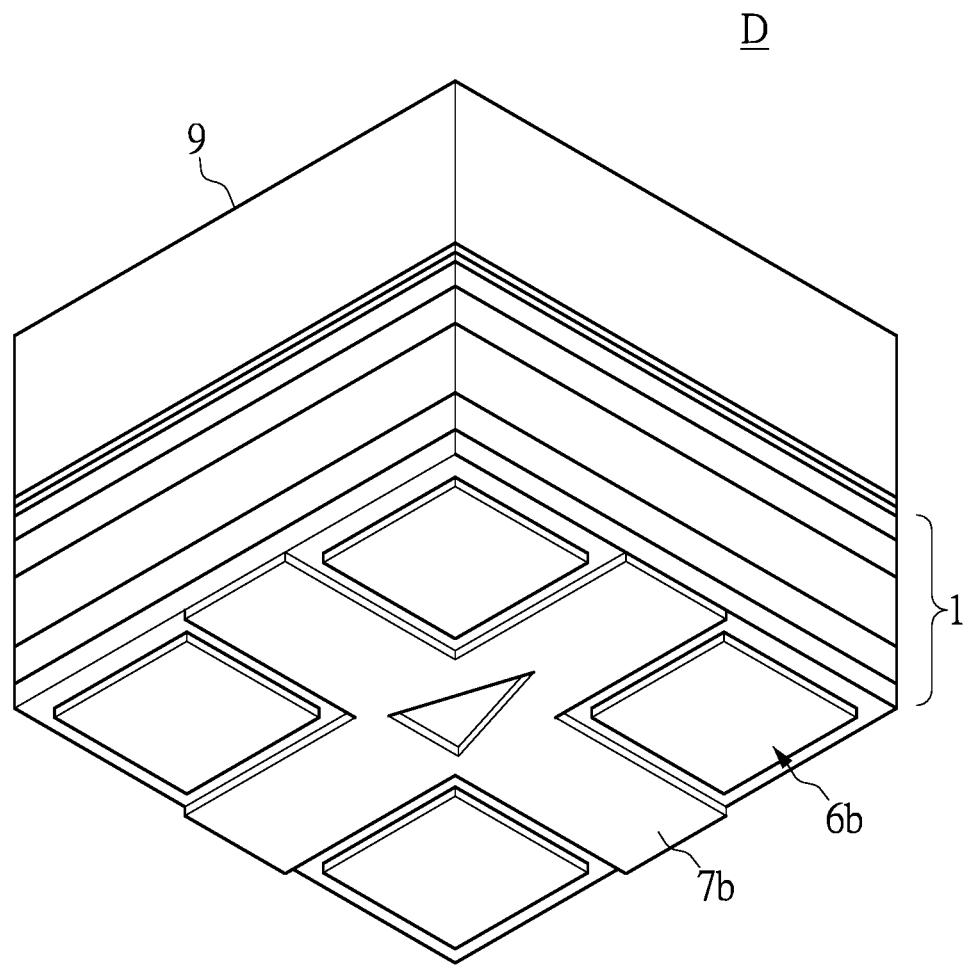
FIG. 12 is another perspective view of the light emitting device according to the second embodiment of the present disclosure.
Figure 13:
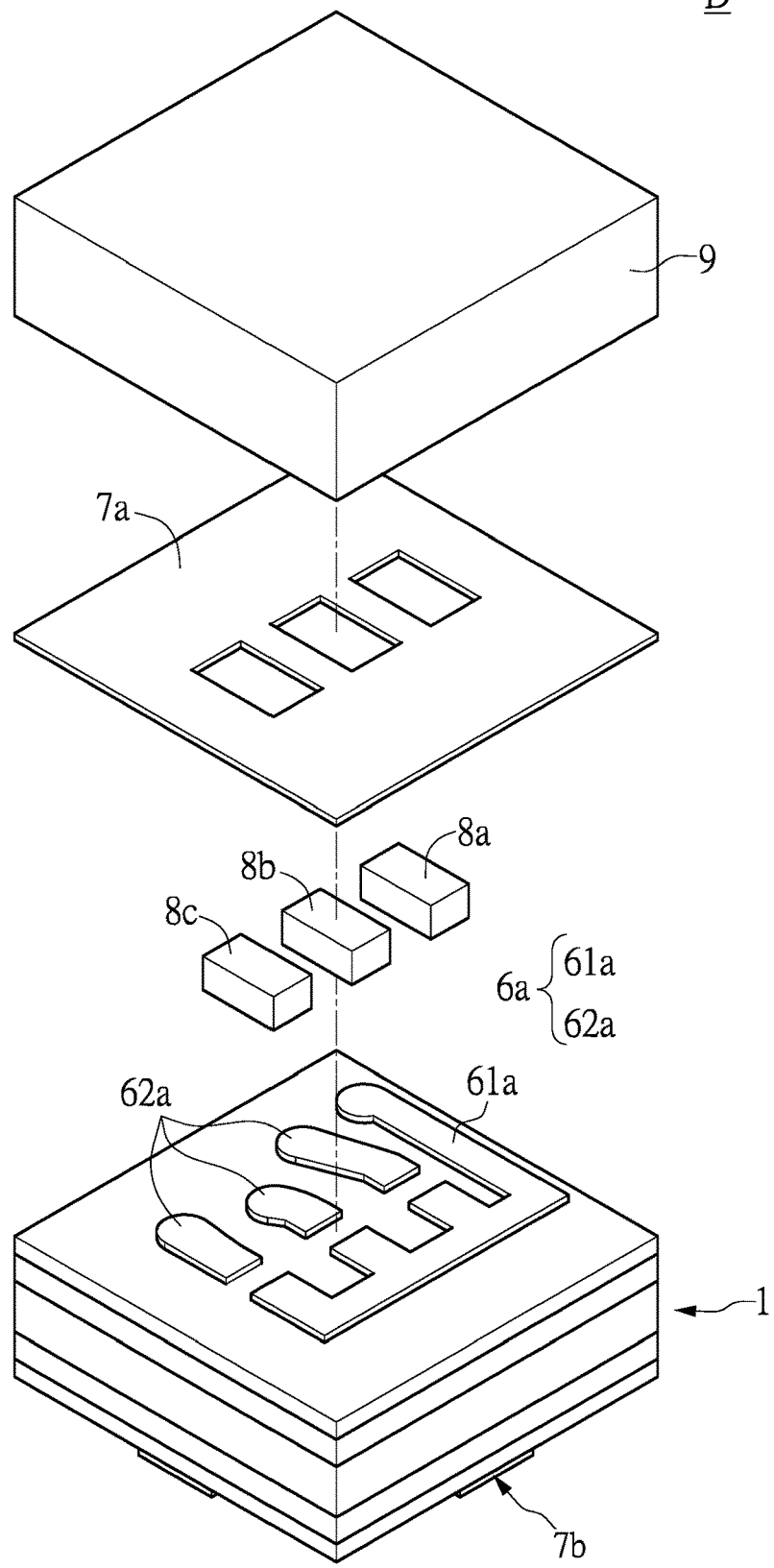
FIG. 13 is a partly exploded perspective view of the light emitting device according to the second embodiment of the present disclosure.
Figure 14:
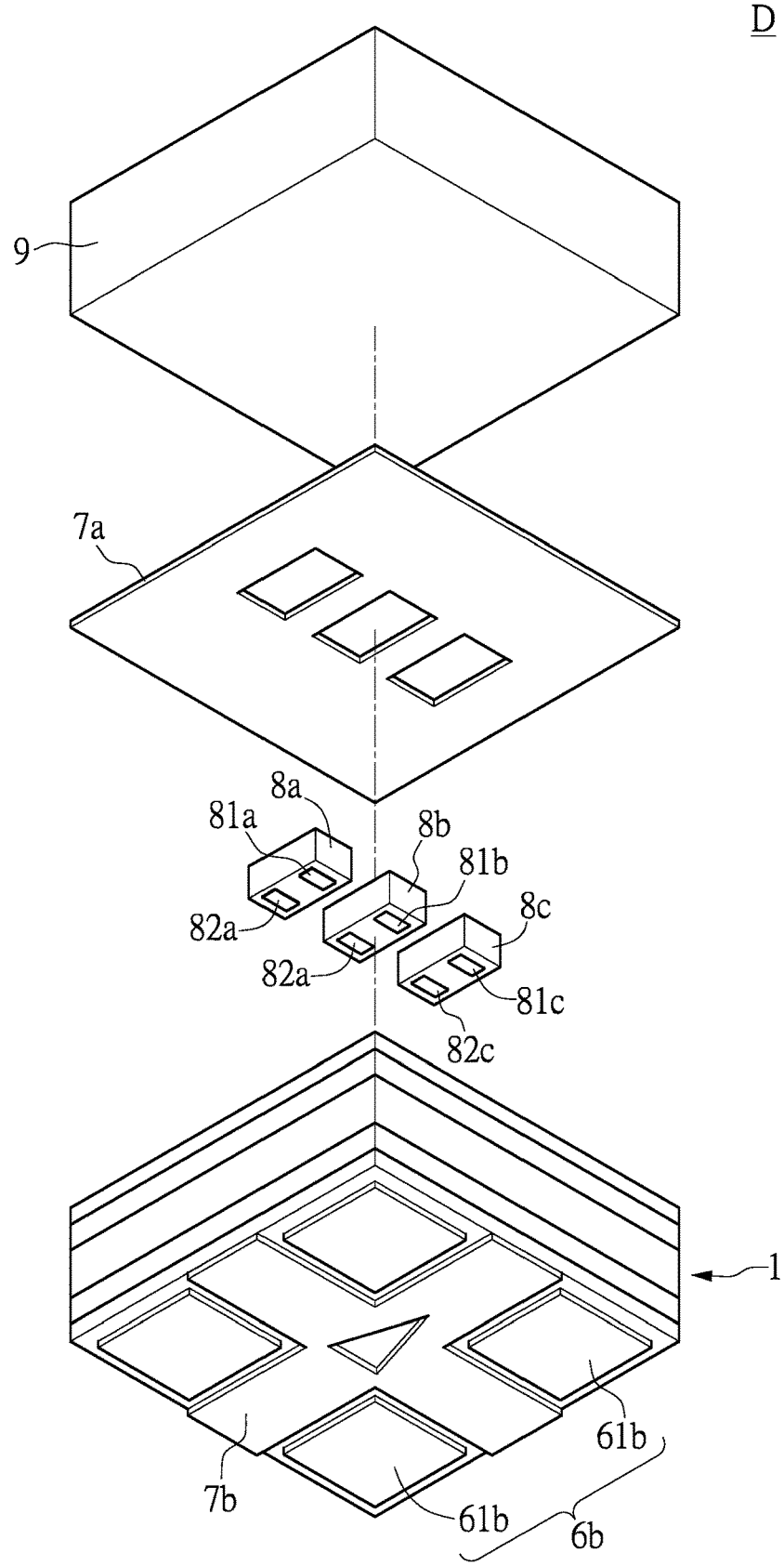
FIG. 14 is another partly exploded perspective view of the light emitting device according to the second embodiment of the present disclosure.

In the present embodiment, as shown in FIG. 5, FIG. 7 and FIG. 9, the control chip 2 has an active surface 22 and a rear surface (not numbered). The active surface 22 corresponds in position to the first surface 11 of the base layer 1, and is formed with a plurality of electrical contacts 221 to receive or transmit electrical signals. The rear surface corresponds in position to the second surface 12 of the base layer 1, and there are no electrical contacts on the rear surface. The first upper patterned metal layer 4a serving as a redistribution layer has a plurality of chip connecting pads 41a and a plurality of first upper conductive pads 42a. The chip connecting pads 41a can lead electrical signals out of the electrical contacts 221 of the control chip 2, and the first upper conductive pads 42a can serve as relay points for signal transmission. The first lower patterned metal layer 4b has a metal mesh layer 41b and a plurality of first lower electrodes 42b adjacent to the metal mesh layer 41b. The metal mesh layer 41b, which does not have any electrical function, is used to provide a balance between the metal amounts of upper and lower sides of the base layer 1, so as to avoid the warpage deformation of the substrate structure Z when being heat pressed. The first lower electrodes 42b can also serve as relay points for signal transmission.

Figure 10:
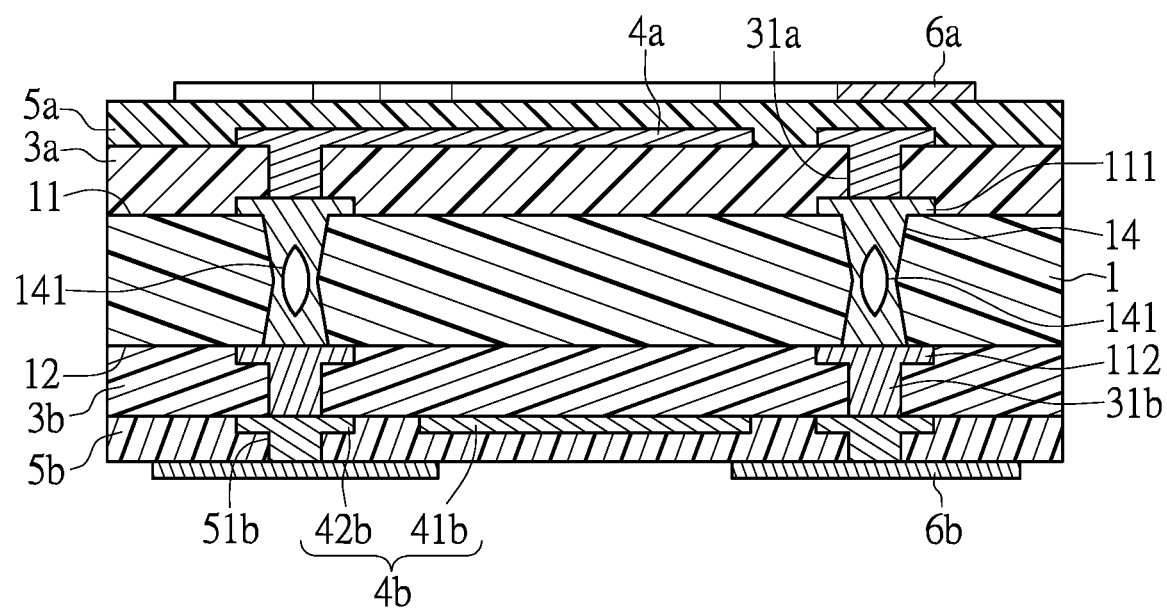
FIG. 10 is a sectional view taken along line X-X of FIG. 1.

In an embodiment of the present disclosure, as shown in FIG. 10, the base layer 1 has a plurality of mid conductive vias 14 that are in proximity to the opening 13. Furthermore, the first surface 11 and the second surface 12 of the base layer 1 are respectively formed with a plurality of first mid conductive pads 111 and a plurality of second mid conductive pads 121, which correspond in position to the mid conductive vias 14. Each of the mid conductive vias 14 has an upper end and a lower end, which are respectively connected to the corresponding first mid conductive pad 111 and the corresponding second mid conductive pad 121 to form a signal transmission path in the thickness direction of the substrate structure Z. The mid conductive vias 14 may be made of copper, but they are not limited thereto. It is worth mentioning that, in consideration of structural design and manufacture process, the mid conductive vias 14 may each have a void 141 when not completely filled with copper.

As shown in FIG. 5, FIG. 7 and FIG. 9, the first upper resin layer 3a has a plurality of first upper conductive vias 31a. A number of the first upper conductive vias 31a correspond in position to the chip connecting pads 41a of the first upper patterned metal layer 4a and the electrical contacts 221 of the control chip 2, i.e., are respectively connected between the chip connecting pads 41a and the electrical contacts 221. Another number of the first upper conductive vias 31a correspond in position to the first upper conductive pads 42a of the first upper patterned metal layer 4a and the first mid conductive pads 111, i.e., are respectively connected between the chip connecting pads 41a and the first mid conductive pads 111. The first lower resin layer 3b has a plurality of first lower conductive vias 31b that correspond in position to the second mid conductive pads 121 and the first lower conductive pads 42b of the first lower patterned metal layer 4b, i.e., are respectively connected between the second mid conductive pads 121 and the first lower conductive pads 42b. The first upper conductive vias 31a and the first lower conductive vias 31b may be made of copper, but they are not limited thereto.

Figure 2:
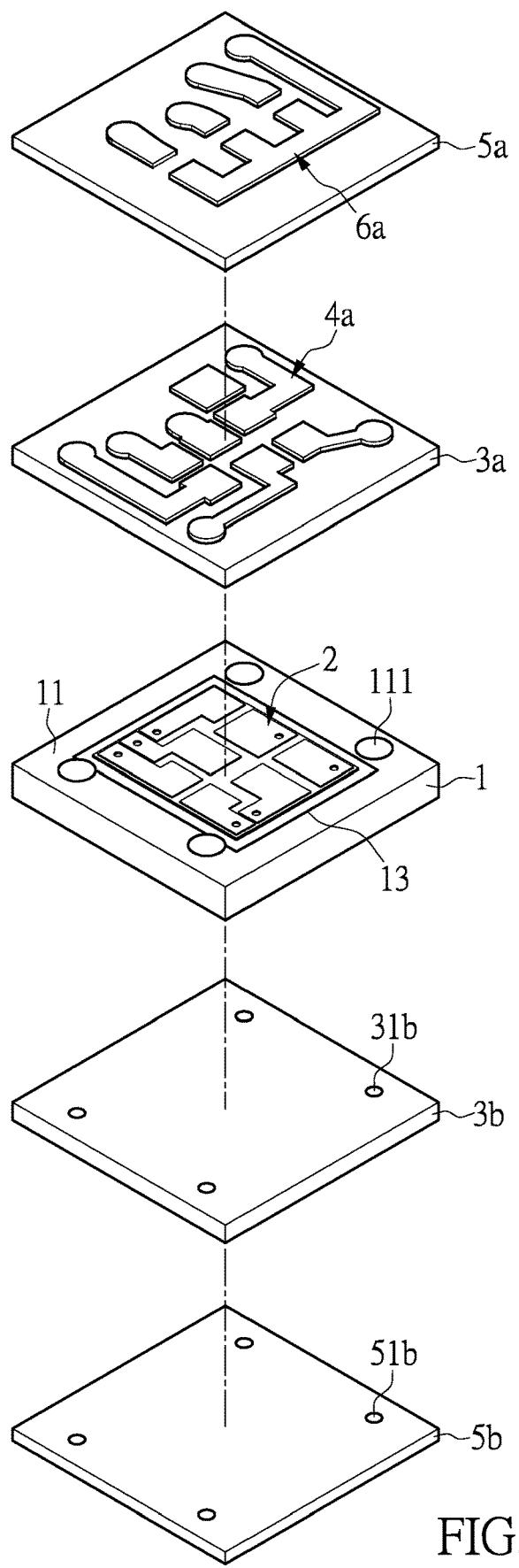
FIG. 2 is an exploded view of the substrate structure with the buried chip according to the first embodiment of the present disclosure.
Figure 3:
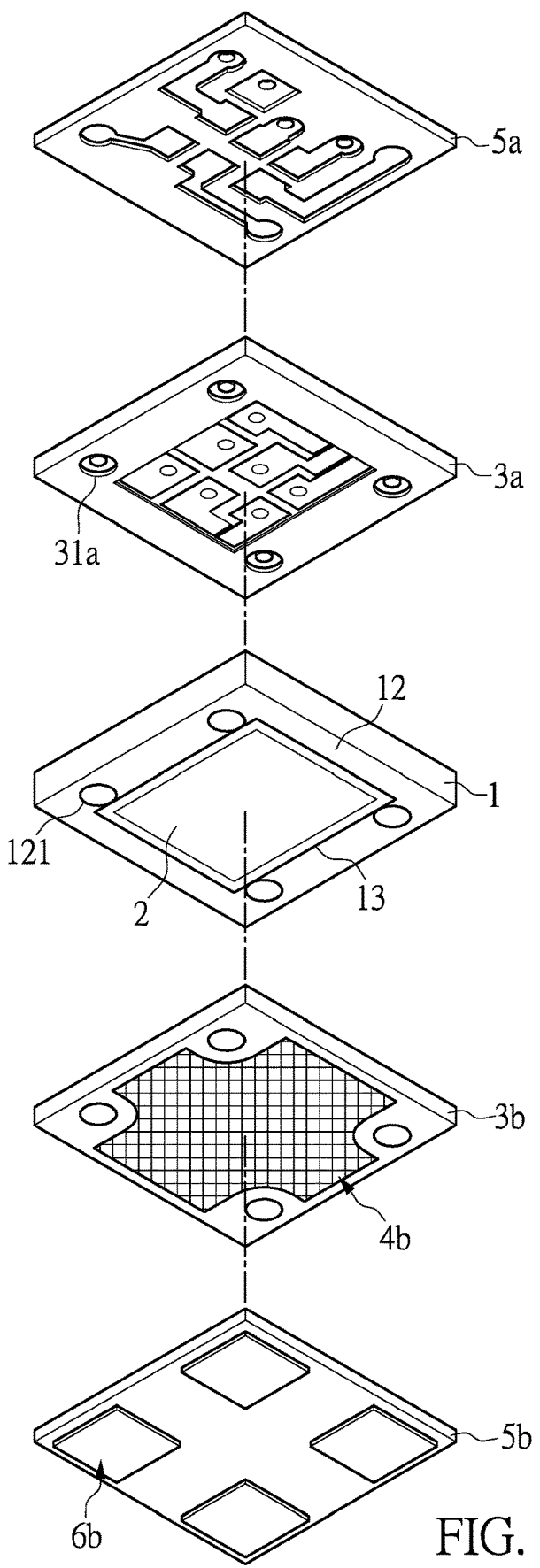
FIG. 3 is another exploded view of the substrate structure with the buried chip according to the first embodiment of the present disclosure.
Figure 4:
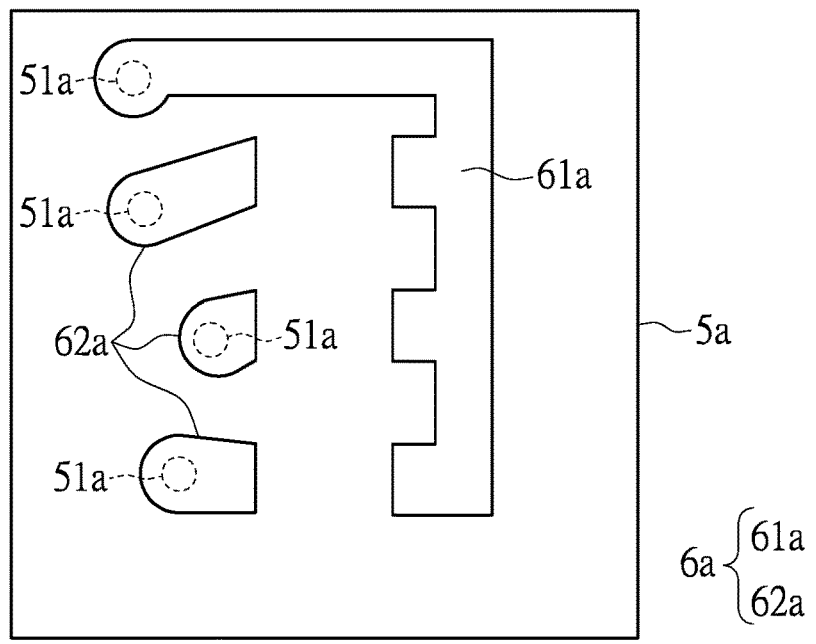
FIG. 4 is a top view of a second upper resin layer and a second upper patterned metal layer of the substrate structure with the buried chip according to the first embodiment of the present disclosure.

As shown in FIG. 2, FIG. 4 and FIG. 7, the substrate structure Z of the present disclosure can further include a second upper resin 5a and a second lower resin layer 5b for the building-up of circuits. The second upper resin 5a is disposed on the first upper patterned metal layer 4a, and the second lower resin layer 5b is disposed on the first lower patterned metal layer 4b. In the present embodiment, the thickness ratio of the second upper resin layer 5a to the second lower resin layer 5b can be 1:1.2. The second upper resin layer 5a and the second lower resin layer 5b can each be a PP (polypropylene) resin layer, but they are not limited thereto. Accordingly, the substrate structure Z can further include a second upper patterned metal layer 6a and a second lower patterned metal layer 6b. The second upper patterned metal layer 6a is disposed on the second upper resin layer 5a, and the second lower patterned metal layer 6b is disposed on the second lower resin layer 5b. The second upper patterned metal layer 6a and the second lower patterned metal layer 6b define signal transmission lines, signal transmission interfaces and/or a connection interface of an external electronic device/functional electronic component. The second upper patterned metal layer 6a and the second lower patterned metal layer 6b may be made of copper, but they are not limited thereto. The technical features of the second upper patterned metal layer 6a and the second lower patterned metal layer 6b will be described in detail in the following embodiments.

In practice, the substrate structure Z of the present disclosure can further include at least one solder mask layer (not shown). The solder mask layer can be formed on the second upper patterned metal layer 6a and expose a portion of the second upper patterned metal layer 6a (e.g., a connection interface). The solder mask layer can also be formed on the second lower resin layer 5b without overlapping the second lower patterned metal layer 6b.

Second Embodiment

Referring to FIG. 11 to FIG. 14, along with FIG. 2 to FIG. 5, a second embodiment of the present disclosure provides a light emitting device D that uses flip-chip package technology. The light emitting device D includes a substrate structure Z, a plurality of lighting elements and a package body 9. The lighting elements are disposed on the substrate structure Z, and the package body 9 covers the lighting elements. The technical details of the substrate structure Z are described in the first embodiment, and will not be reiterated herein. In the present embodiment, the lighting elements are respectively a first lighting element 8a, a second lighting element 8b and a third lighting element 8c, which are disposed on the second upper patterned metal layer 6a of the substrate structure Z and arranged in a row at predetermined intervals, but they are not limited thereto.

In an embodiment of the present disclosure, the second upper patterned metal layer 6a has a common electrode 61a and a plurality of individual electrodes 62a. The first lighting element 8a, the second lighting element 8b and the third lighting element 8c are each a flip-chip type LED, each of which has a first electrode 81a, 81b, 81c and a second electrode 82a, 82b, 82c. The first electrodes 81a, 81b, 81c have the same polarity (e.g., anode polarity) and are all bonded to the common electrode 61a. The second electrodes 82a, 82b, 82c have the same polarity (e.g., cathode polarity) and are respectively bonded to the individual electrodes 62a. Therefore, wiring bonding spaces are not required on the second upper patterned metal layer 6a, which contributes to reducing the gaps between the lighting elements. Furthermore, the light emitting device D is provided without bonding wires, so that the reliability of the light emitting device D can be increased.

The second upper resin layer 5a has a plurality of second upper conductive vias 51a, each of which has one end connected to the common electrode 61a or the corresponding one of the individual electrodes 62a of the second upper patterned metal layer 6a and the other end connected to the corresponding one of the chip connecting pads 41a or the first upper conductive pads 42a of the first upper patterned metal layer 4a. Accordingly, signal transmission paths can be formed in the thickness direction of the substrate structure Z. The second upper conductive vias 51a may be made of copper, but they are not limited thereto.

In practice, the first lighting element 8a is configured to emit red light. For this purpose, the first lighting element 8a may be a red LED chip, or may include a blue LED chip and a wavelength converting layer formed on the blue LED chip, in which the wavelength converting layer may contain a red phosphor. The second lighting element 8b is configured to emit green light. For this purpose, the second lighting element 8b may be a green LED chip, or may include a blue LED chip and a wavelength converting layer formed on the blue LED chip, in which the wavelength converting layer may contain a green phosphor. The third lighting element 8c is configured to emit blue light. For this purpose, the third lighting element 8c may be a blue LED chip. Accordingly, the lights emitted from the first lighting element 8a, the second lighting element 8b and the third lighting element 8c having different colors can uniformly mix together to produce white light. However, these examples are not meant to limit the scope of the present disclosure. The light colors and implementation manners of the lighting elements can be changed by persons skilled in the art.

The second lower patterned metal layer 6b of the substrate structure Z has a plurality of connecting pads 61b separated from each other. In use, the light emitting device D of the present disclosure can be mounted on a circuit board (not shown) by the connecting pads 61b. The second lower resin layer 5b has a plurality of second lower conductive vias 51b, each of which has one end connected to the corresponding one of the first lower conductive pads 42b of the first lower patterned metal layer 4b and the corresponding one of the connecting pads 61b of the second lower patterned metal layer 6b. Accordingly, signal transmission paths can be formed in the thickness direction of the substrate structure Z. The second lower conductive vias 51b may be made of copper, but they are not limited thereto.

In the present embodiment, the light emitting device D includes a first solder mask layer 7a and a second solder mask layer 7b. The first solder mask layer 7a can be disposed on the second upper patterned metal layer 6a and expose the common electrode 61a and the individual electrodes 62a. The second solder mask layer 7b can be disposed on the second lower patterned metal layer 6b and expose the connecting pads 61b.

Third Embodiment

Figure 15:
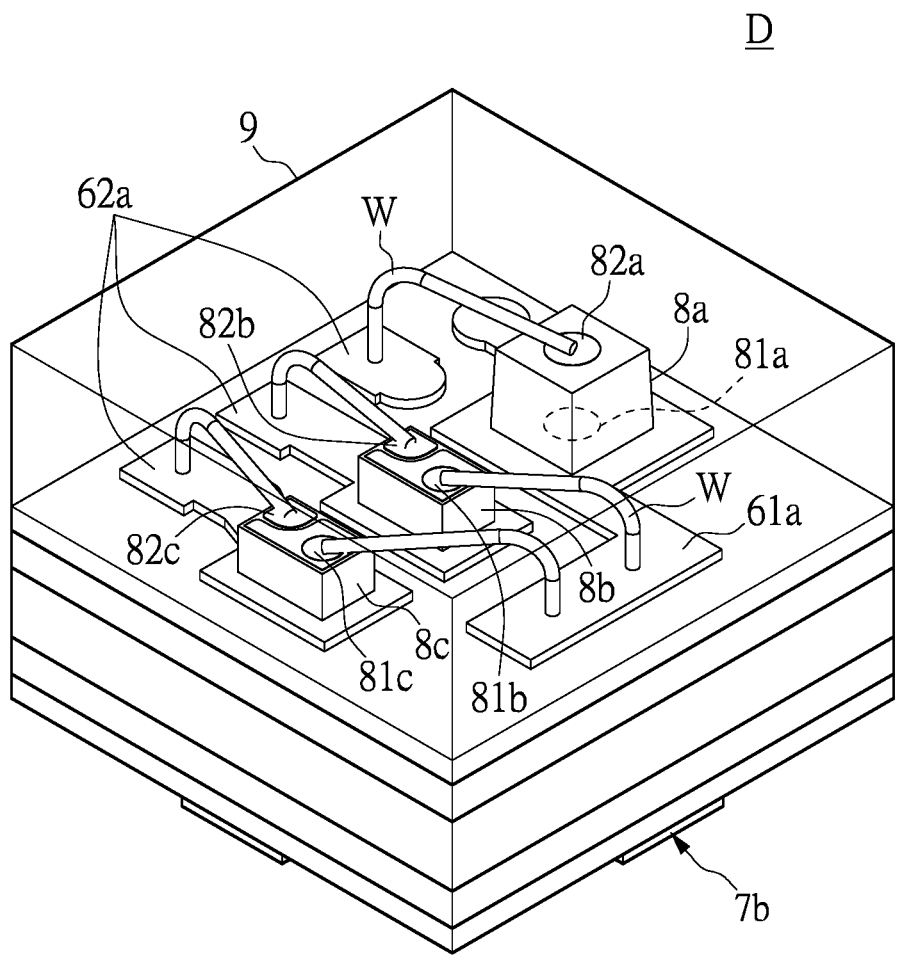
FIG. 15 is a perspective view of a light emitting device according to a third embodiment of the present disclosure.
Figure 16:
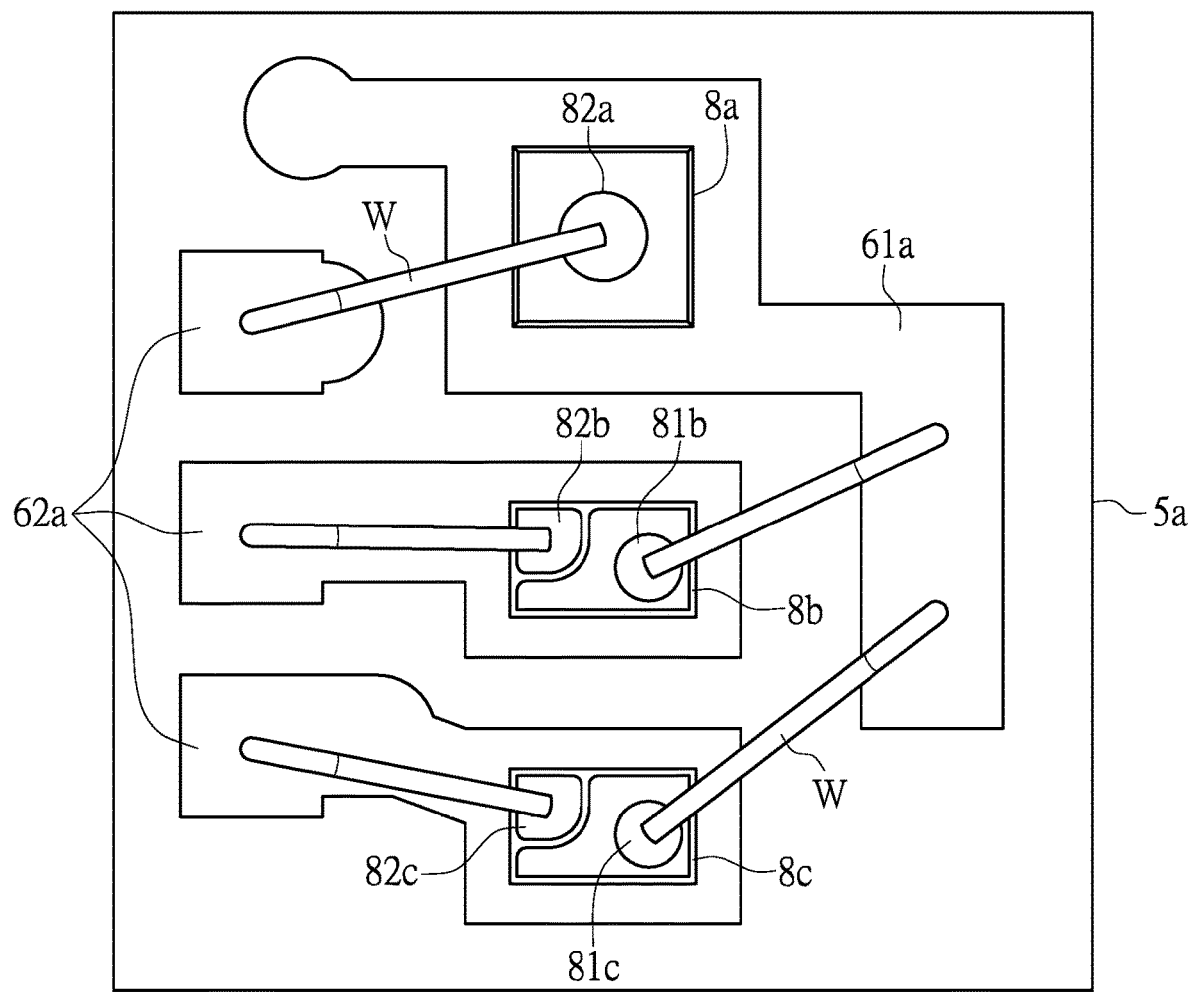
FIG. 16 is a top view of the light emitting device according to the third embodiment of the present disclosure.
Figure 17:
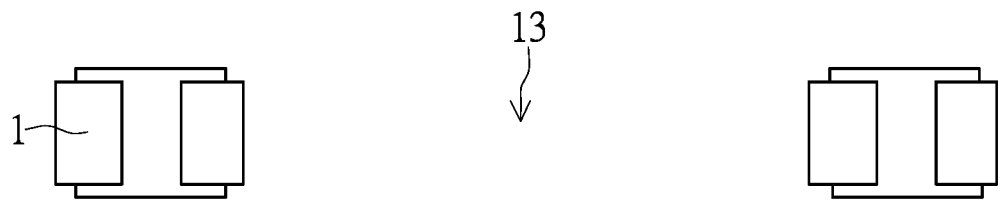
FIG. 17 to FIG. 25 are schematic views showing a process for manufacturing the substrate structure with the buried chip of the present disclosure.
Figure 18:
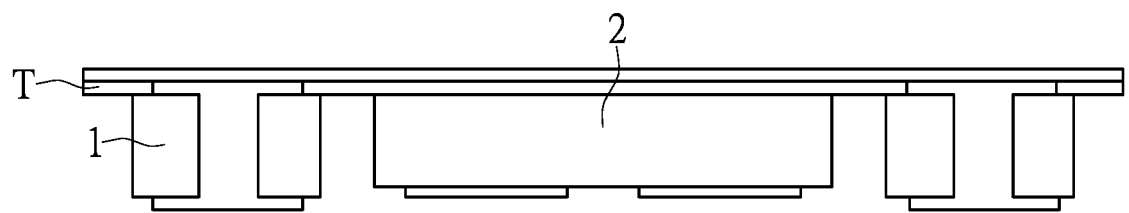
Figure 19:
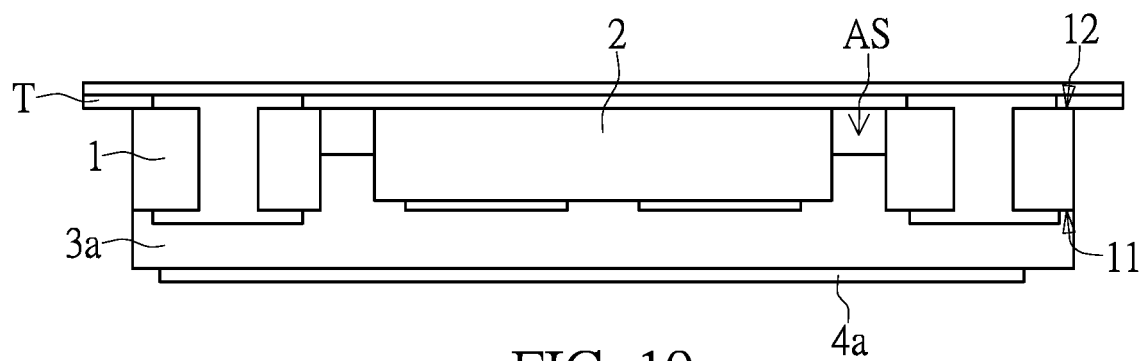
Figure 20:
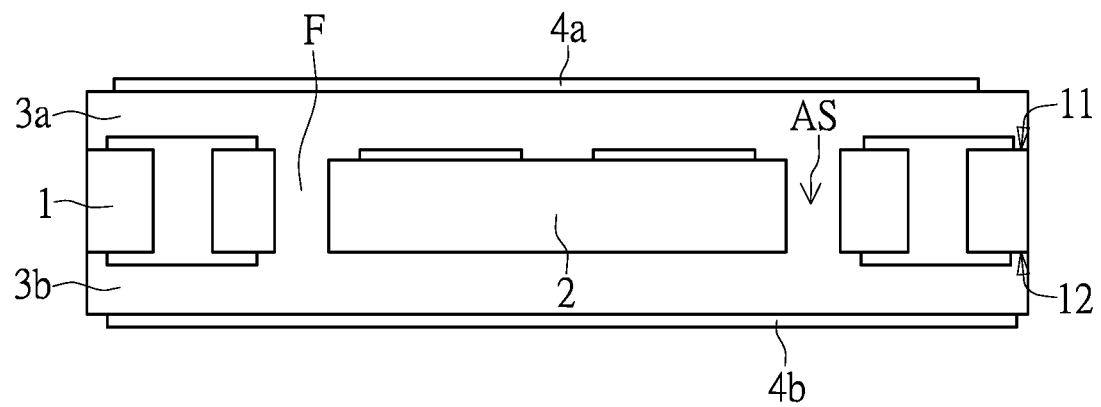
Figure 21:
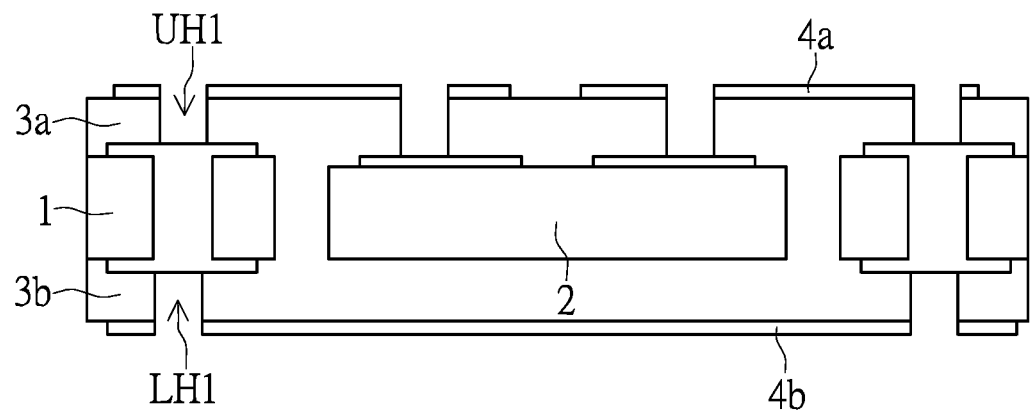
Figure 22:
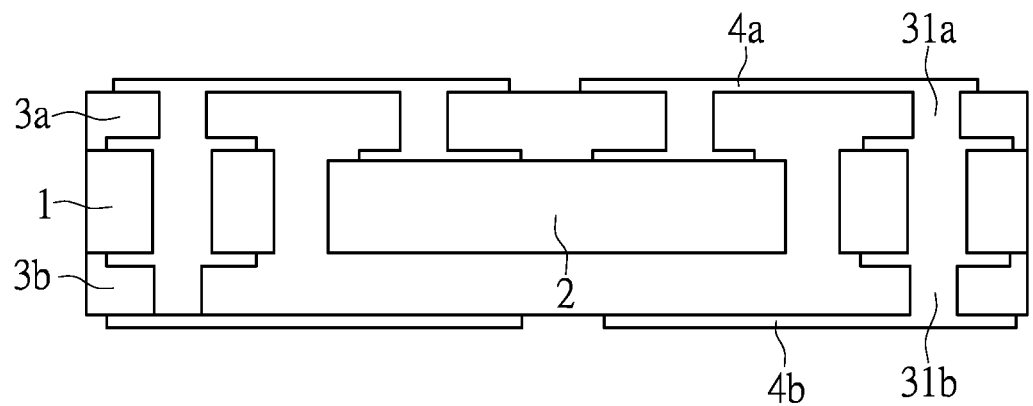
Figure 23:
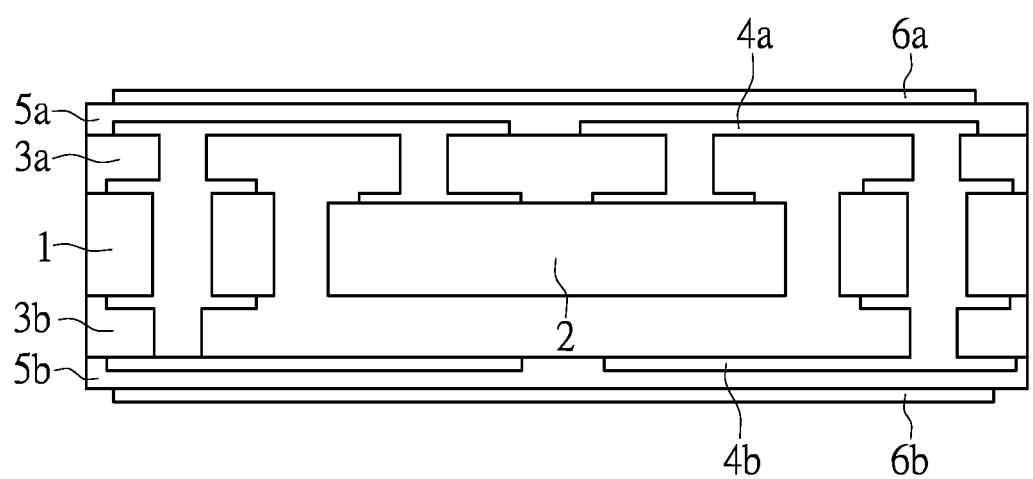
Figure 24:
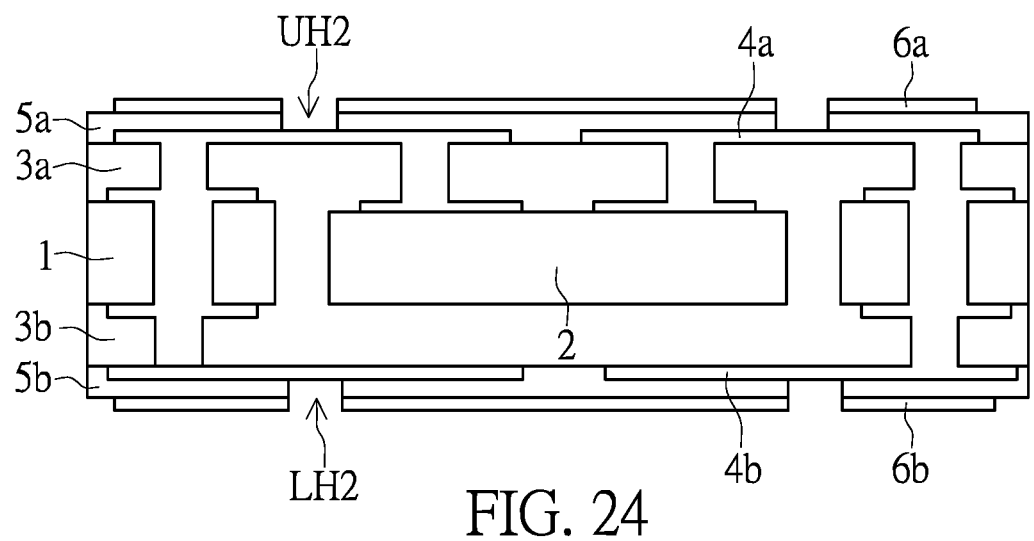
Figure 25:
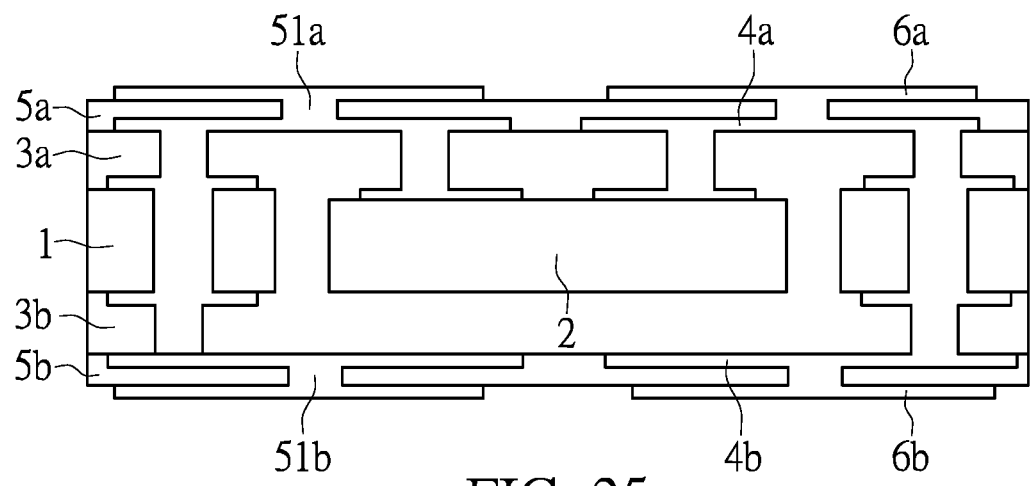

Referring to FIG. 15 and FIG. 16, a third embodiment of the present disclosure provides a light emitting device D that uses wire bonding package technology. The light emitting device D includes a substrate structure Z, a plurality of lighting elements and a package body 9. The lighting elements are disposed on the substrate structure Z, and the package body 9 covers the lighting elements. The technical details of the substrate structure Z and the lighting elements are described in the first and second embodiments, and will not be reiterated herein.

In the present embodiment, the first lighting element 8a is a vertical type red LED chip and is disposed on one of the individual electrodes 62a. The first lighting element 8a has a first electrode 81a and a second electrode 82a. The first electrode 81a is located at a top portion of the first lighting element 8a and is electrically connected to the common electrode 61a by a wire W. The second electrode 82a is located at a bottom portion of the first lighting element 8a and is bonded to the corresponding individual electrode 62a. The second lighting element 8b is a horizontal type green LED chip and is disposed on another one of the individual electrodes 62a. The second lighting element 8b has a first electrode 81b and a second electrode 82b, which are located at a top portion thereof and are respectively and electrically connected to the common electrode 61a and the corresponding individual electrode 62a by a wire W. The third lighting element 8c is a horizontal type blue LED chip and is disposed on still another one of the individual electrodes 62a. The third lighting element 8c has a first electrode 81c and a second electrode 82c, which are located at a top portion thereof and are respectively and electrically connected to the common electrode 61a and the corresponding individual electrode 62a by a wire W. However, the above-mentioned description for the lighting elements is merely an example and is not meant to limit the scope of the present disclosure.

In the present embodiment, the light emitting device D merely includes a second solder mask layer 7b. The second solder mask layer 7b can be disposed on the second lower resin layer 5b and expose the connecting pads 61b.

One of the effects of the present disclosure is that the substrate structure can provide sufficient cushion and protection for the control chip and ensure the normal operation of the buried chip by the technical features of "the control chip is disposed in the opening of the base layer and defines an annular space having a width between 10 μm and 100 μm" and "the annular space is sealed by the first upper resin layer and the first lower resin layer." In addition, the light emitting device of the present disclosure, in which a plurality of light emitting elements are disposed on the substrate structure, can meet the design requirements of miniaturization and optimize the display effects of displaying devices.

Furthermore, the control chip is individually packaged in the substrate structure, and the lighting elements are each mounted on the substrate structure in a flip-chip manner. Accordingly, the area of the substrate structure can be reduced by at least 60%, while the gaps between the lighting elements are reduced significantly. Therefore, a display device using the light emitting device of the present disclosure can have an enhanced display effect to provide for a user's enjoyment.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light emitting device comprising a substrate structure and a plurality of light emitting elements disposed on the substrate structure, wherein the substrate structure includes:
   a base layer having a first surface, a second surface opposite to the first surface, and an opening passing through the first surface and the second surface, the opening having an inner wall surface, wherein the base layer includes at least one conducting structure;
   a control chip disposed in the opening and having an outer wall surface, wherein an annular space is defined by the outer wall surface and the inner wall surface and has a width between 10 μm and 100 μm;
   a filling layer filled in the annular space;
   a first upper resin layer disposed on the first surface;
   a first lower resin layer disposed on the second surface;
   a first upper patterned metal layer disposed on the first upper resin layer; and
   a first lower patterned metal layer disposed on the first lower resin layer, wherein the first upper patterned metal layer and the first lower patterned metal layer are electrically connected to each other by the at least one conducting structure, and wherein the first lower patterned metal layer includes a first metal layer not having any electrical function and a second metal layer adjacent to the first metal layer, and the second metal layer is connected to the at least one conducting structure;
   wherein the annular space is sealed by the first upper resin layer and the first lower resin layer, and the control chip is fixed in place by the filling layer;
   wherein the substrate structure includes a common electrode and a plurality of individual electrodes that are disposed on the first upper resin layer;
   wherein each of the light emitting elements has a first electrode and a second electrode, the first electrodes are all connected to the common electrode, and the second electrodes are respectively connected to the individual electrodes.

2. The light emitting device according to claim 1, wherein the light emitting elements are all disposed on the common electrode.

3. The light emitting device according to claim 1, wherein a thickness of the base layer is 0 μm to 20 μm less than a height of the control chip.

4. The light emitting device according to claim 1, wherein a thickness ratio of the first upper resin layer to the first lower resin layer is 1:1.

5. The light emitting device according to claim 1, wherein a material of the base layer is different from that of the first upper resin layer and that of the first lower resin layer.

6. The light emitting device according to claim 1, wherein the filling layer is integrated with the first upper resin layer and the first lower resin layer.

7. The light emitting device according to claim 6, wherein the annular space is not completely filled by the filling layer, and at least one void is formed in the annular space.

8. The light emitting device according to claim 1, wherein the control chip has a plurality of electrical contacts on a surface thereof that is in proximity to the first surface, and the electrical contacts are electrically connected to the first upper patterned metal layer.

9. The light emitting device according to claim 8, wherein the first metal layer is a metal mesh layer, and the second metal layer is a metal conductive layer.

10. The light emitting device according to claim 9, wherein the substrate structure further includes a second upper resin layer and a second lower resin layer, the second upper resin layer is disposed on the first upper patterned metal layer, and the second lower resin layer is disposed on the first lower patterned metal layer.

11. The light emitting device according to claim 10, wherein the substrate structure further includes a second upper patterned metal layer and a second lower patterned metal layer, the second upper patterned metal layer is disposed on the second upper resin layer and electrically connected to the first upper patterned metal layer, and the second lower patterned metal layer is disposed on the second lower resin layer and electrically connected to the first lower patterned metal layer.

* * * * *